(12) United States Patent
Pang et al.

(10) Patent No.: US 8,446,178 B2
(45) Date of Patent: May 21, 2013

(54) COMPARATOR AND ANALOG-TO-DIGITAL

(75) Inventors: Shifu Pang, Shenzhen (CN); Ding Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/338,042

(22) Filed: Dec. 27, 2011

(65) Prior Publication Data
US 2012/0161872 A1 Jun. 28, 2012

(30) Foreign Application Priority Data
Dec. 27, 2010 (CN) .......................... 2010 1 0613957

(51) Int. Cl.
*H03K 5/22* (2006.01)
(52) U.S. Cl.
USPC ................ 327/66; 327/53; 327/65; 327/89; 327/307
(58) Field of Classification Search
USPC ............... 327/63, 52, 53, 54, 55, 56, 57, 65, 327/66, 67, 74, 87, 88, 89, 307
See application file for complete search history.

(56) References Cited

U.S. PATENT DOCUMENTS

| | | | |
|---|---|---|---|
| 6,008,673 A | 12/1999 | Glass et al. | |
| 6,617,926 B2* | 9/2003 | Casper et al. | 330/258 |
| 6,768,442 B2* | 7/2004 | Meyers et al. | 341/158 |
| 7,330,390 B2* | 2/2008 | Baker | 365/207 |
| 7,518,411 B2* | 4/2009 | Kim et al. | 327/52 |
| 7,728,632 B1* | 6/2010 | Bi | 327/65 |
| 2002/0113627 A1 | 8/2002 | Iga | |
| 2005/0163198 A1 | 7/2005 | Wei et al. | |

FOREIGN PATENT DOCUMENTS

| | | |
|---|---|---|
| CN | 85104156 A | 6/1986 |
| CN | 101316114 A | 12/2008 |
| JP | 2002246892 A | 8/2002 |

OTHER PUBLICATIONS

Chinese Patent No. 102045044, issued on Sep. 19, 2012, granted in corresponding Chinese Patent Application No. 201010613957.5.

* cited by examiner

*Primary Examiner* — Lincoln Donovan
*Assistant Examiner* — Jung H Kim
(74) *Attorney, Agent, or Firm* — Brinks Hofer Gilson & Lione

(57) ABSTRACT

A comparator includes: a pre-amplification module, configured to generate two amplified differential signal reference currents according to an input voltage and a reference voltage; and a differential signal obtaining module, configured to obtain a differential signal according to the two amplified differential signal reference currents. The pre-amplification module includes a differential unit, an offset unit, and an amplification unit, where the differential unit is configured to generate two direct current bias currents according to the input voltage and the reference voltage; the offset unit is configured to generate an offset current of the two direct current bias currents according to the input voltage and the reference voltage, so as to reduce magnitude of the two direct current bias currents and obtain two differential signal reference currents; the amplification unit is configured to receive the two differential signal reference currents, and amplify the two differential signal reference currents.

8 Claims, 3 Drawing Sheets

COMPARATOR AND ANALOG-TO-DIGITAL

CROSS-REFERENCE TO RELATED APPLICATIONS

This application claims priority to Chinese Patent Application No. 201010613957.5, filed on Dec. 27, 2010, which is hereby incorporated by reference in its entirety.

FIELD OF THE INVENTION

The present invention relates to electronic technologies, and in particular to a comparator and an analog-to-digital converter.

BACKGROUND OF THE INVENTION

An analog-to-digital converter (Analog-to-Digital Converter, ADC) is a device converting an analog signal into a digital signal, and is widely applied to electronic products in fields such as meters, communication, signal detection, image processing, and multimedia. With the development of electronic products, requirements on precision, speed and power consumption of the ADC become higher and higher, and a comparator in the ADC has a crucial effect on the precision, speed and power consumption of the ADC. Therefore, how to reduce the power consumption of the comparator and improve the speed and precision of the comparator becomes the focus of research in recent years.

A circuit of a comparator in the prior art is shown in FIG. 1, where M5, M6, M7 and M8 are differential transistors, reference voltages are VREFP and VREFN, input voltages are VINP and VINN, and when VINP-VINN>VREFP-VREFN, current I13 flowing into M13 is greater than current I12 flowing through M12. Since M15 mirrors the current of M13, and M14 mirrors the current of M12, change of the input differential voltage signals VINP and VINN is converted into change of the currents of M12, M13, M14 and M15.

In a pre-amplifying circuit of the comparator in the prior art, the input voltage is converted into a current difference between M12 and M13. However, since M14 and M15 mirror the currents of M12 and M13, and meanwhile amplify the currents of M12 and M13, the currents of M14 and M15 are amplified and delivered to a next-level comparison circuit. The next-level comparison circuit obtains a comparison result of M14 and M15, and meanwhile, the power consumption of the comparator is increased by the amplified direct current bias current. In addition, M18 and M19 of the second level need to adopt higher specification to allow greater current to pass through due to the power consumption of the direct current, which causes the speed reduction of the comparator. Moreover, when a clock CLK is at a low level, it cannot be ensured that one of M18 and M19 is in a conduction state and the other is in a cutoff state, which further increases the power consumption of the comparator.

SUMMARY OF THE INVENTION

Embodiments of the present invention provide a comparator and an analog-to-digital converter, so as to solve the problem that the comparator has high power consumption and low speed in the prior art.

An embodiment of the present invention provides a comparator, which includes:

a pre-amplification module, configured to generate two amplified differential signal reference currents according to an input voltage and a reference voltage; and a differential signal obtaining module, configured to obtain a differential signal according to the two amplified differential signal reference currents output by the pre-amplification module, where the pre-amplification module includes a differential unit, an offset unit, and an amplification unit;

the differential unit is configured to generate two direct current bias currents according to the input voltage and the reference voltage;

the offset unit is configured to generate an offset current of the two direct current bias currents according to the input voltage and the reference voltage, so as to reduce the magnitude of the two direct current bias currents and obtain two differential signal reference currents; and the amplification unit is configured to receive the two differential signal reference currents, and perform amplification processing on the two differential signal reference currents.

An embodiment of the present invention provides an analog-to-digital converter, which includes at least one comparator provided by the embodiment of the present invention.

In the comparator and the analog-to-digital converter provided by the embodiments of the present invention, the offset unit is used to partially offset the two direct current bias currents of the current differential signal, where the two direct current bias currents are generated by the pre-amplification module, so as to input only a difference between the two direct current bias circuits into the differential signal obtaining module, and thereby reduce the power consumption of the comparator and reduce the power consumption of the analog-to-digital converter.

BRIEF DESCRIPTION OF THE DRAWINGS

To illustrate the technical solutions according to the embodiments of the present invention or in the prior art more clearly, accompanying drawings to be used for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

In order to make the objectives, technical solutions, and advantages in the embodiments of the present invention more clear, the technical solutions in the embodiments of the present invention will be clearly and completely described in the following with reference to the accompanying drawings in the embodiments of the present invention. It is obvious that the embodiments to be described are only a part rather than all of the embodiments of the present invention. All other embodiments obtained by persons skilled in the art based on the embodiments of the present invention without creative efforts shall fall within the protection scope of the present invention.

Figure 1:
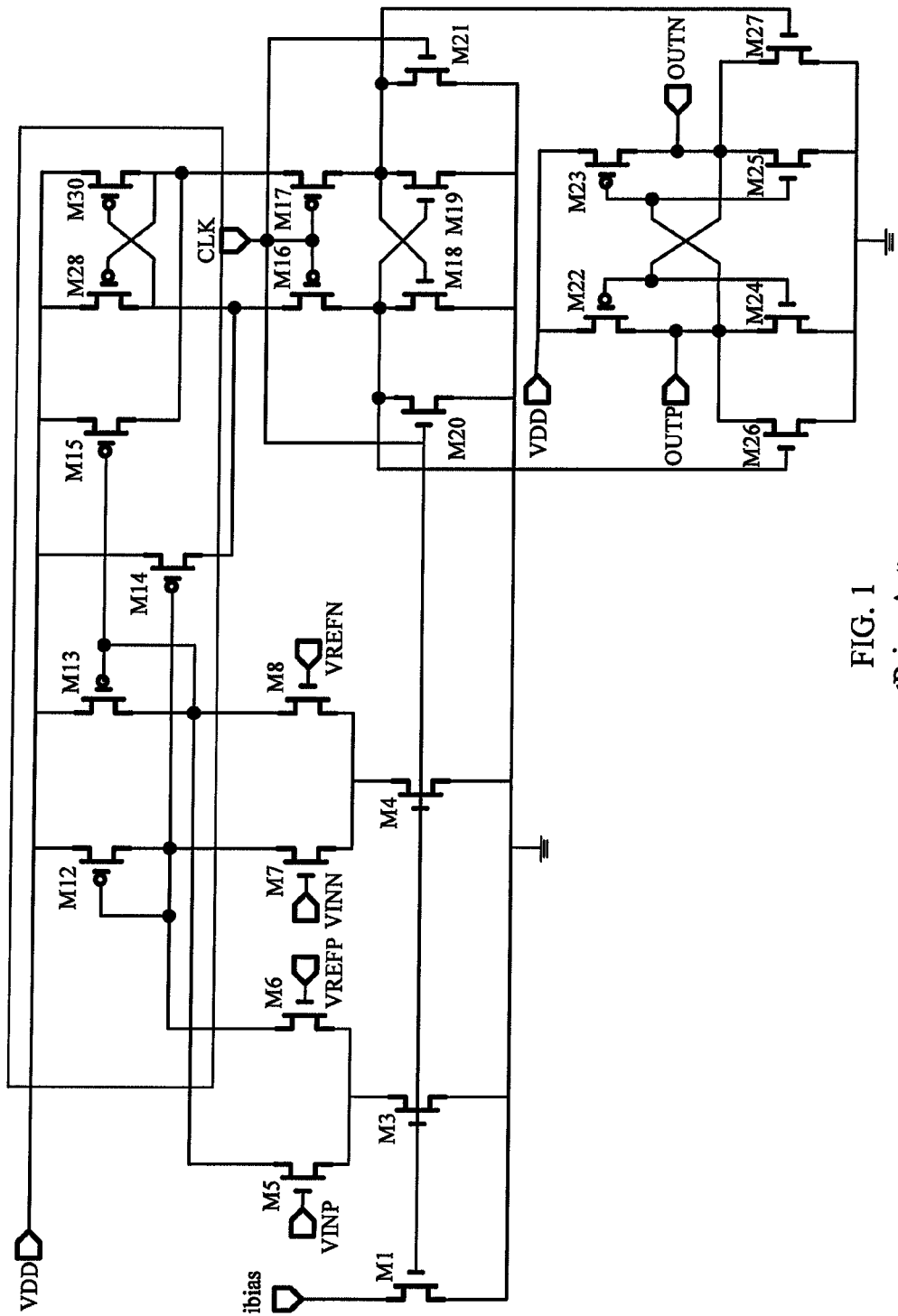
FIG. 1 is a circuit diagram of a comparator in the prior art.
Figure 2:
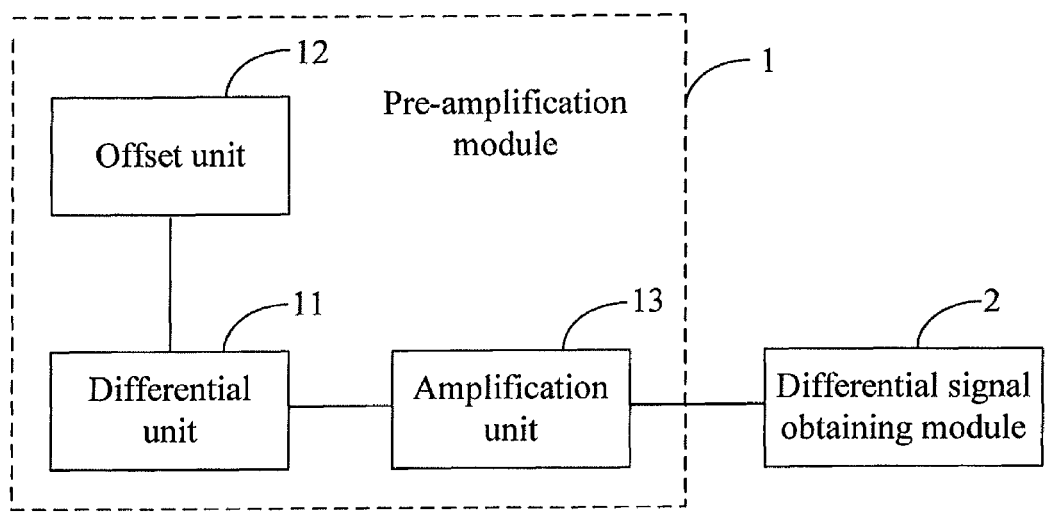
FIG. 2 is a schematic structural diagram of a comparator embodiment according to the present invention.

FIG. 2 is a schematic structural diagram of a comparator embodiment according to the present invention. As shown in FIG. 2, the comparator includes: a pre-amplification module 1 and a differential signal obtaining module 2.

The pre-amplification module 1 is configured to generate two differential signal reference currents according to an input voltage and a reference voltage.

The pre-amplification module 1 may include a differential unit 11, an offset unit 12, and an amplification unit 13. The differential unit 11 is configured to generate two direct current bias currents according to the input voltage and the reference voltage. The offset unit 12 is configured to generate an offset current of the two direct current bias currents, so as to reduce the magnitude of the two direct current bias currents and obtain two differential signal reference currents.

In the embodiment of the present invention, the magnitude of the offset current may be equal to that of one of the two direct current bias currents. The amplification unit 13 is configured to receive the two differential signal reference currents, and perform amplification processing on the two differential signal reference currents. Definitely, the offset unit 12 outputs the same offset currents to the two direct current bias currents, so as to ensure that a difference between the two offset direct current bias currents is not affected by the offset currents.

Specifically, the differential unit 11 includes a differential pair, configured to receive the input voltage and the reference voltage. Generally, the differential pair may be formed by differential elements such as two triodes, a field effect transistor or a metal oxid semiconductor (metal oxid semiconductor, MOS) field effect transistor, the input voltage or the reference voltage applied on the differential elements enables the differential elements to be conducted, and when the differential elements are connected to a start power source, the direct current bias current is generated on the differential elements. The higher the input voltage or the reference voltage applied on the differential elements is, the greater the direct current bias current passing through the differential elements is; on the contrary, the lower the input voltage or the reference voltage applied on the differential elements is, the smaller the direct current bias current passing through the differential elements is. When the input voltage or the reference voltage applied on the differential elements is lower than a start voltage of the differential elements, the differential elements cannot normally work, that is, the direct current bias current is not generated on the differential elements. Therefore, it can be seen that, the magnitude of the input voltage and the reference voltage applied on the differential pair may be embodied as the conduction capability of the differential elements in the differential pair, that is, a difference between the input voltage and the reference voltage may be converted into a difference between the direct current bias currents generated respectively on two differential elements in the differential pair.

In the embodiment of the present invention, when the differential unit 11 merely includes one differential pair, the input voltage and the reference voltage are respectively input into the two differential elements in the differential pair to conduct the respective current channel start power sources, so each of the two differential elements in the differential pair generates one direct current bias current.

When the differential unit 11 includes two differential pairs, one group of input voltage and reference voltage is input into each differential pair, and a difference between the direct current bias currents corresponding to the reference voltages of the two differential pairs is input, where a current output by each differential pair under the respective input voltage and the reference voltage is used as the respective output direct current bias current.

The differential signal obtaining module 2 is configured to obtain a differential signal according to the two amplified differential signal reference currents output by the pre-amplification module 1. In the embodiment of the present invention, the differential signal obtaining module 2 may obtain the differential signal through a difference between the two amplified differential signal reference currents.

In the embodiment of the present invention, the offset unit 12 reduces one of the two direct current bias currents output by the differential unit 11 to 0, which reduces the power consumption of the direct current of the comparator. It should be understood that, since the magnitude of the offset current may also be less than that of any one of the two direct current bias currents, the power consumption of the comparator caused by the two direct current bias currents may also be reduced to a certain degree.

The offset unit 12 may offset the direct current bias current in the differential unit 11, and an electronic element in the offset unit 12 may be a same element as the differential element in the differential unit 11. If the pre-amplification circuit 1 includes one differential pair, as for the two differential elements for voltage comparison, two offset currents with the same magnitude may be output by the offset unit 12 respectively to the two differential elements. Directions of the two offset currents are opposite to those of the direct current bias currents generated by the differential element, and the magnitude of the offset current may be equal to that of a smaller one of the two direct current bias currents flowing from the two differential element, so that the direct current bias current flowing from the corresponding differential element is fully offset, while the direct current bias current flowing from the other differential element is a difference between the output direct current bias current flowing from the other differential element itself and the offset current. It can be seen that, the direct current bias current finally flowing from the other differential element is a difference between the direct current bias currents flowing from the two differential elements. Therefore, the amplification unit 13 merely needs to amplify the difference between the direct current bias currents and then delivers the amplified current to the differential signal obtaining module 2.

It should be noted that, if the type of the electronic element in the offset unit 12 is the same as that of the differential element in the differential unit 11, if the size of the electronic element in the offset unit 12 is the same as that of the differential element in the differential unit 11, and the elements are connected to a same start power source, offset currents with the same magnitude and a opposite direction may be output to the differential elements in the differential unit 11; while if the size of the electronic element in the offset unit 12 is less than that of the differential element in the differential unit 11, when the two elements are connected to a same power source, a partial offset current can be output.

If the differential unit 11 includes two differential pairs, for ease of description, a bias current difference output by one of the differential pairs is referred to as a first bias current, and a bias current difference output by the other differential pairs is referred to as a second bias current. In this case, the offset unit 12 may, output two offset currents with the same magnitude, where one offset current is used for offsetting the first bias current, the other offset current is used for offsetting the second bias current, and the magnitude of the offset currents is equal to that of a smaller current value of the first bias current and the second bias current. Thereby, a smaller one of the first bias current and the second bias current may be fully offset through one of the offset currents, while the remaining bias current is partially offset, so that the current input into the differential signal obtaining module 2 is a difference between the first bias current and the second bias current amplified by the amplification unit 13.

Figure 3:
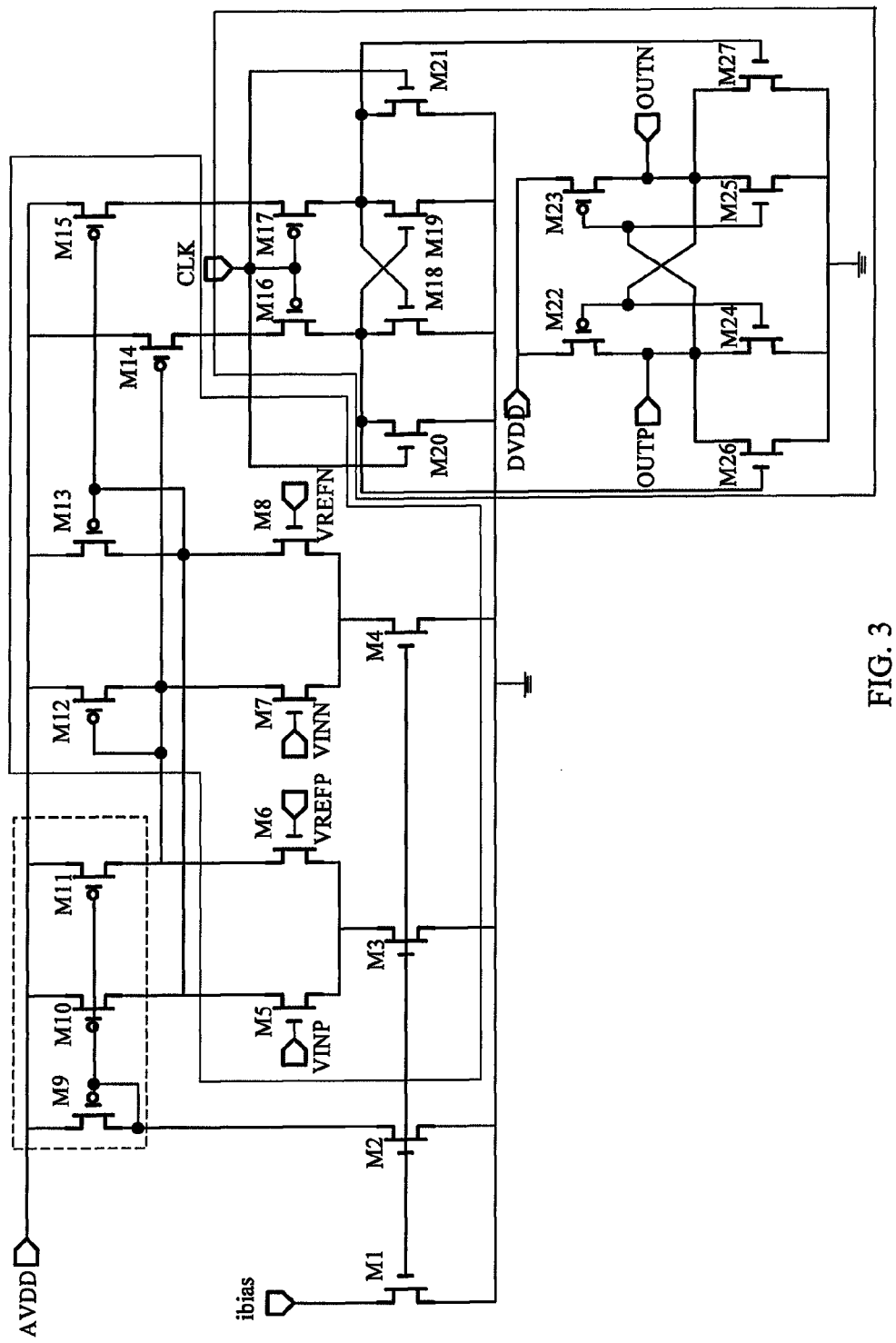
FIG. 3 is a circuit diagram of another comparator embodiment according to the present invention.

FIG. 3 is a circuit diagram of another comparator embodiment according to the present invention. As shown in FIG. 3:

On the basis of the above embodiment, preferably, the differential unit includes at least one differential pair formed by a MOS field effect transistor.

The amplification unit includes at least two MOS transistors, where the at least two MOS transistors include an MOS transistor for mirroring the two direct current bias currents and an MOS transistor for amplifying the two differential signal reference currents.

The offset unit may offset the direct current bias current in the differential unit, where the offset unit may include at least two MOS transistors.

At least one MOS transistor of the at least two MOS transistors is configured to fully offset a smaller direct current bias current of the two direct current bias currents generated by the differential unit.

At least one MOS transistor of the at least two MOS transistors is configured to partially offset a greater direct current bias current of the two direct current bias currents generated by the differential unit.

The MOS transistor in the differential unit is a PMOS, and the MOS transistor in the offset unit may be an NMOS transistor; or the MOS transistor in the differential unit is the NMOS, and the MOS transistor in the offset unit is the PMOS transistor.

The MOS transistor in the offset unit may be connected to the MOS transistor in the differential unit, so as to offset the direct current bias current flowing from the MOS transistor in the offset unit by using a current reverse property of the PMOS transistor and the NMOS transistor.

Further, the differential signal obtaining module may include: a latching unit and a square wave shaping unit.

The latching unit is configured to buffer and latch the two amplified differential signal reference currents output by the pre-amplification module.

The square wave shaping unit is configured to perform square wave shaping on a signal output by the latching unit to output a digital signal.

The latching unit may be formed by two pairs of NMOS transistors cross-coupled to each other, and the square wave shaping unit may be a Latch circuit.

This embodiment provides a specific circuit diagram of the comparator, and the circuit diagram is merely an exemplary implementation circuit for implementing the present invention, which is not intended to limit the present invention.

Referring to FIG. 3, in the embodiment of the present invention, the differential unit in the pre-amplification module includes the following two differential pairs formed by the NMOS transistors: M5 and M6, and M7 and M8. The amplification unit is formed by the PMOS transistors M12 and M13, and M14 and M15. The offset unit includes the PMOS transistors M9, M10 and M11, where M9 is configure to generate an offset current under the effect of the start power source AVDD, and currents flowing through M10 and M11 are mirror currents of a current flowing through M9.

Grids of M5 and M7 are connected to the input voltage, and grids of M6 and M8 are respectively connected to a positive reference voltage and a negative phase reference voltage. AVDD is a constant voltage, and M5 and M6 generate a direct current bias current and M7 and M8 generate a direct current bias current under the control and conduction of the input voltage and the reference voltage. It can be seen from FIG. 3 that, the current of M13 is equal to a difference between the direct current bias currents of M5 and M7, and the current of M12 is equal to a difference between the direct current bias currents of M6 and M8. The offset current is output to the differential pairs M5 and M6, and M7 and M8 through M10 and M11, where the output offset current may be a minimum value of a difference between the currents of M5 and M7, and a difference between the currents of M6 and M8, so that a smaller direct current bias current of the two differential pairs may be fully offset, that is, one direct current bias current of M12 and M13 is 0, and the other direct current bias current is a difference between the difference between the currents of M5 and M7 and the difference between the currents of M6 and M8.

Since a current flowing through M14 is a mirror current of a current flowing through M12, a current flowing through M15 is a mirror current of a current flowing through M13, and M14 and M15 amplifies the currents of M12 and M13, a proportion at which M14 amplifies the current of M12 may be implemented through a size proportion of M14 to M12, and a proportion at which M15 amplifies the current of M13 may be implemented through a size proportion of M15 to M13. For example, if M14 and M12 are same electronic elements, and the size of M14 is 5 times greater than that of M12, M14 can amplify the current of M12 up to 5 times.

One direct current bias current in M12 and M13 is 0, and the other direct current bias current is a difference between the difference between the currents of M5 and M7 and the difference between the currents of M6 and M8. Then, one direct current bias current in M14 and M15 is 0, and the other direct current bias current is an amplified difference between the difference between the currents of M5 and M7 and the difference between the currents of M6 and M8.

FIG. 3 illustrates a case that the offset unit offsets the two direct current bias currents in the differential unit. As another feasible implementation manner, the offset unit may also offset two direct current bias currents mirrored in the amplification unit, where the offset unit includes at least two MOS transistors.

At least one MOS transistor of the at least two MOS transistors is configured to fully offset a smaller direct current bias currents mirror of the two direct current bias currents mirrored in the amplification unit.

At least one MOS transistor of the at least two MOS transistors is configured to partially offset a greater direct current bias current of the two direct current bias currents mirrored in the amplification unit.

If the MOS transistor for mirroring the two direct current bias currents in the amplification unit is the PMOS, the MOS transistor in the offset unit is an NMOS transistor; or if the MOS transistor for mirroring the two direct current bias currents in the amplification unit is the NMOS, the MOS transistor in the offset unit is a PMOS transistor.

That is to say, the electronic elements in the offset unit may be directly connected to the electronic elements for mirroring the two direct current bias currents in the amplification unit, for example, connected to M12 and M13 to directly offset a smaller one of the direct current bias currents in M12 and M13, so that one output direct current bias current in M12 and M13 is 0, and the direct current bias current in one of M14 and M15 is 0.

Further, the differential signal obtaining module may include a latching unit and a square wave shaping unit. The latching unit includes two pairs of NMOS transistors cross-coupled to each other, that is, M18, M19, M20 and M21. The square wave shaping unit includes one two-level Latch circuit, that is, two output ends OUTP and OUTN, and DOUTN and DOUTP; M16 and M17 are switch components.

An working process of the differential signal obtaining module is as follows: when a clock signal Clk is at a high level, the latching unit is reset; and when Clk is at a low level, the latching unit obtains a current difference signal according to the direct current bias current output by the pre-amplification module 1, and begins to work, where a difference (Iout+− Tout−) is amplified by the cross-coupled NMOS transistors till the difference is stable and a next high level arrives.

The differential signal obtaining module latches and amplifies the current difference signal, where M18, M19, M20 and M21 form a gain unit. The square wave shaping unit is configured to shape the signal output by the latching unit, to remove noise interference in the output signal, so that the output signal is more approximate to a digital square wave signal. The square wave shaping unit is a Latch circuit, configured to obtain a final comparison result.

It should be noted that, in the embodiment of the present invention, a misalignment voltage of the comparator is formed by misalignment voltages of the pre-amplification module and the differential signal obtaining module. The misalignment voltage of the pre-amplification module is mainly caused by mismatch of M5, M6, M7 and M8. Therefore, when the pre-amplification module is designed, the effect of M5, M6, M7 and M8 needs to be noticed, and the noise and parasitic capacitance is reduced as much as possible to reduce the effect on the pre-amplification module. In addition, a time constant of the pre-amplification module may be reduced, and A(s) of the pre-amplification module is increased, so as to decrease a transmission delay of the comparator.

Two power sources AVDD and DVDD may be respectively adopted as the pre-amplification module and the difference signal obtaining module in this embodiment, thereby reducing the effect of the difference signal obtaining module on the pre-amplification module, and facilitating performance of the comparator.

In addition, in this embodiment, the problem that in a low-voltage deep-submicron process, a power source voltage of the system cannot meet the requirements on normal work of the device can be solved, and a low power source voltage circuit may be applied. In this embodiment, only one clock signal Clk is used, which can reduce the design difficulty and reduce the area and power consumption of the entire comparator.

An embodiment of the present invention further provides an analog-to-digital converter embodiment, where the analog-to-digital converter includes at least one comparator provided by the embodiment of the present invention.

The function of the analog-to-digital converter (ADC) is converting an analog signal into a digital signal, and a comparator is an important component in any high-speed high-resolution analog-to-digital converter (ADC). The analog-to-digital converter provided by the embodiment of the present invention may have multiple types such as a Sigma-Delta ADC, a pipeline ADC or a FLASH ADC. The analog-to-digital converters of these types all need a high-speed high-performance comparator. Especially, in the Sigma-Delta ADC and the pipeline ADC, speed, power consumption and misalignment voltage have a crucial effect on the whole circuit.

The analog-to-digital converter provided by the embodiment is adopted, where a gain difference amplifier is adopted as the comparator, the offset unit offsets the direct current bias current in the differential module, and only the difference between the currents in the differential module is delivered into the pre-amplification module, so that the power consumption of the pre-amplification module is reduced and then the power consumption of the entire comparator is reduced. The analog-to-digital converter formed by the comparator has low power consumption, a high speed, a small chip area, and a simple circuit, which greatly reduces the system cost.

Finally, it should be noted that the foregoing embodiments are merely used for describing the technical solutions of the present invention, but not intended to limit the present invention. Although the present invention has been illustrated in detail with reference to the embodiments, it should be understood by persons of ordinary skill in the art that modifications may be made to the technical solutions described in the foregoing embodiments, or equivalent replacements may be made to some technical features in the technical solutions, and such modifications or replacements do not make the corresponding technical solutions depart from the spirit and scope of the technical solutions of the present invention.

What is claimed is:

1. A comparator, comprising:
    a pre-amplification module, configured to generate two amplified differential signal reference currents according to an input voltage and a reference voltage; and
    a differential signal obtaining module, configured to obtain a differential signal according to the two amplified differential signal reference currents output by the pre-amplification module,
    wherein the pre-amplification module comprises a differential unit, an offset unit, and an amplification unit;
    the differential unit is configured to generate two direct current bias currents according to the input voltage and the reference voltage;
    the offset unit is configured to generate an offset current of the two direct current bias currents, so as to reduce magnitude of the two direct current bias currents and obtain two differential signal reference currents; and
    the amplification unit is configured to receive the two differential signal reference currents, and perform amplification processing on the two differential signal reference currents,
    wherein the differential unit comprises at least one differential pair formed by two MOS field effect transistors;
    the amplification unit comprises at least two MOS transistors for mirroring the two direct current bias currents and at least two MOS transistors for amplifying the two differential signal reference currents.

2. The comparator according to claim 1, wherein the offset unit comprises at least two MOS transistors;
    at least one MOS transistor of the at least two MOS transistors is configured to fully offset a smaller direct current bias current of the two direct current bias currents generated by the differential unit; and
    at least one MOS transistor of the at least two MOS transistors is configured to partially offset a greater direct current bias current of the two direct current bias currents generated by the differential unit.

3. The comparator according to claim 2, wherein if the MOS transistors in the differential unit are PMOS transistors, the MOS transistors in the offset unit are NMOS transistors; or if the MOS transistors in the differential unit are NMOS transistors, the MOS transistors in the offset unit are PMOS transistors.

4. The comparator according to claim 1, wherein the offset unit comprises at least two MOS transistors;
    at least one MOS transistor of the at least two MOS transistors is configured to fully offset a smaller direct current bias current of the two direct current bias currents mirrored in the amplification unit; and at least one other MOS transistor of the at least two MOS transistors is configured to partially offset a greater direct current bias current of the two direct current bias currents mirrored in the amplification unit.

5. The comparator according to claim 4, wherein if the at least two MOS transistors for mirroring the two direct current bias currents in the amplification unit are PMOS transistors, the MOS transistors in the offset unit are NMOS-transistors; or if the MOS transistors for mirroring the two direct current bias currents in the amplification unit are NMOSs, the MOS transistors in the offset units are PMOSs.

6. The comparator according to claim 1, wherein the differential signal obtaining module comprises:
   a latching unit, configured to buffer and latch the two amplified differential signal reference currents output by the pre-amplification module; and
   a square wave shaping unit, configured to perform square wave shaping on a signal output by the latching unit to output a digital signal.

7. The comparator according to claim 6, wherein the latching unit is formed by two pairs of NMOS transistors cross-coupled to each other.

8. The comparator according to claim 6, wherein the square wave shaping unit is a Latch circuit.

* * * * *